United States Patent [19]

Tsunashima

[11] 3,909,680

[45] Sept. 30, 1975

[54] PRINTED CIRCUIT BOARD WITH SILVER MIGRATION PREVENTION

[75] Inventor: Eiichi Tsunashima, Hirakata, Japan

[73] Assignee: Matsushita Electric Industrial Co., Ltd., Osaka, Japan

[22] Filed: May 23, 1974

[21] Appl. No.: 472,802

[30] Foreign Application Priority Data

Feb. 16, 1973 Japan ................................ 48-19654

Feb. 20, 1973 Japan ................................ 48-20930

[52] U.S. Cl............... 317/101 C; 156/90; 174/68.5; 338/309; 338/334

[51] Int. Cl.²...................... H01C 13/00; H02B 9/00

[58] Field of Search ........... 338/308, 309, 254, 252, 338/334; 317/101 C, 258; 174/68.5; 156/90

[56] References Cited

UNITED STATES PATENTS

| | | | |
|---|---|---|---|
| 2,758,267 | 8/1956 | Short | 317/258 |
| 3,649,945 | 3/1972 | Waits | 338/309 |
| 3,775,725 | 11/1973 | Endo | 338/254 |

*Primary Examiner*—E. A. Goldberg

*Attorney, Agent, or Firm*—Wenderoth, Lind & Ponack

[57] ABSTRACT

In a printed circuit board, on which there are formed printed components such as resistors and capacitors and printed conductors, which comprise silver or silver powder and resin, such as an electrode of a component and a connecting conductor, there are provided under coating layer and/or an over coating layer comprising insulating resin and an organic inhibitor so as to prevent migration of silver from the conductor of a higher potential to the conductor of a lower potential.

15 Claims, 20 Drawing Figures

PRINTED CIRCUIT BOARD WITH SILVER MIGRATION PREVENTION

BACKGROUND OF THE INVENTION

This invention relates to a printed circuit board used in electronic equipment such as a radio receiver, a tape recorder and a TV receiver, etc., and more especially to an improved printed circuit board on which there are conductive parts made of silver containing material and migration of the silver thereof is suppressed.

For miniaturization and simplification of electronic circuits and assembly thereof, there are conventionally used printed circuit boards with conductors made by etching of a copper layer or printing of silver paint thereof and printed resistors made of resistor paint comprising carbon and resin or silver powder and resin. However, as silver components are widely used in such a printed circuit board, for example, for electrodes of the printed resistors and other conductive parts, there is conventionally a problem of migration of silver. That is, dur to migration of silver, there is caused deterioration of the appearances of the outside of the board, and further sometimes there is caused an electric short-circuit.

Therefore, an object of the present invention is to provide an improved printed circuit board in which migration of silver, which is caused between the conductive parts of the printed circuit on the board, is suppressed.

Another object of the invention is to provide an improved printed circuit board haivng a stabilized performance, especially even when it is kept in an atmosphere with high humidity for a long time.

A further object of the invention is to provide an improved printed circuit arrangement which has high reliability and stability of the electric characteristics so that it can be widely used for various applications.

These objects of the present invention are achieved by providing an improved printed circuit board according to the invention, which has at least one printed electronic component such as a resistor or a capacitor, and conductors, such as electrodes, for said component, said circuit board being a flat plate, cylinder or bar, said component and said conductors being formed on at least one surface of the insulating substrate of said printed circuit board, and said conductors being made of silver or silver and resin, and which printed circuit board has an under coating layer and/or an over coating layer which comprises insulating resin and organic inhibitor and which is provided on the surface of said circuit board where said component and said conductors are formed, that is, said under coating layer being formed on the board before the forming of said component and said conductors on the board, and/or said over coating layer being formed after the forming of said component and said conductors, whereby migration of silver, which is contained in said conductors, from the conductor of higher potential to the conductor of lower potential can be suppressed.

DETAILED DESCRIPTION OF THE INVENTION

Figure 1:
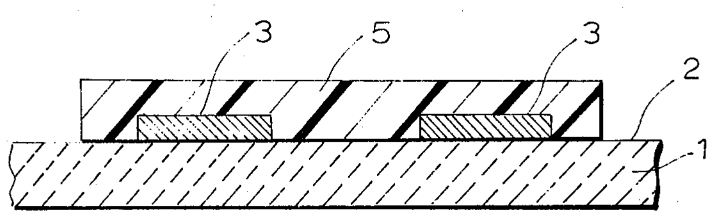
FIG. 1 is a schematic sectional view of the printed circuit board according to the invention in which an over coat is formed at the location of the printed conductive component.

For the insulating substrate of the printed circuit board, on which electric circuit components such as conductors, resistors and capacitors to be formed, there are used inorganic materials such as alumina ceramic, forsterite ceramics and glass, and organic materials such as phenolic resin impregnated in a paper base and epoxy resin impregnated in a glass cloth base. For the shape of the substrate, usually a flat plate is used as it is suitable for screen printing. However, it is also possible to use a cylindrical, spherical or bar-shaped substrate. The printed components such as conductors, resistors and capacitors can be formed at the edge and the wall of the whole of the plate shaped substrate and the inside and edge of the cylindrical substrate.

The operable materials for the printed conductors to be formed on these boards include copper, gold, silver, zinc, nickel, platinum and palladium. The powders of these materials are mixed with organic resin, solvent, etc. and the conductor is formed from the resultant paste. For the printed resistors, paste is used which is made by mixing a power of a material such as carbon and oxide of tin, silver, palladium, nickel and ruthenium with organic resin, solvent, etc. For the printed capacitors, a paste is used which is made by mixing a powder of a material such as aluminum, barium titanate, titanium dioxide, tantalum, silica, glass, zinc oxide, zirconium and niobium with resin, solvent, etc.

These printed components the conductors, resistors and capacitors are formed by applying the paste as described above to the insulating substrate by means of spraying, roller coating, dipping, screen printing, etc., evaporating the solvent in the paste and firing the applied paste at a high temperature. After forming of each of the components by printing and firing the respective paste, firing is continued for all of the components so as to stabilize the formed conductors, resistors and capacitors.

As the resistors and capacitors are sensitive to humidity, usually the surface of these printed components is coated with a protective layer for preventing damage due to humidity. This is not required for a conductor such as the silver electrode, and in order to reduce the amount of the coating material needed the protective layer is formed in a limited area, i.e., on the surface of the resistor or capacitor and in the vicinity thereof. Further, in order to print the resistor without causing defects of the substrate such as cracks and dust and to get high reproducibility of the resistance value, sometimes the under coat is selectively applied on the substrate only at the portion where the resistor is to be formed. However, conventionally the selective undercoat is not applied for a conductor, because it is considered that coating the insulating substrate with insulating resin is very wasteful and has no effect.

A capacitor formed on the printed circuit board and having parallel electrodes can not have a large capacitance, and a laminated capacitor with opposite electrodes has a low voltage withstanding ability. On the other hand, as resistor paste is available having a sheet resistance value over a wide range of 1Ω to 10 MΩ, most of the resistors necessary for a circuit can be replaced by a printed resistor. Therefore, a combination of printed conductors and printed resistors is usually used in a printed circuit arrangement.

As described above, the usual printed circuit is formed by printing the conductors and the resistors on the insulating substrate, and for the material of the resistors a mixed paste of carbon and resin is usually used. Although the resultant resistor made by this paste is somewhat deficient as regards stability with respect to temperature and humidity, the cost of the paste is relatively low compared to other materials. For the material of the electrode of such a resistor, mixture of silver and resin is widely used since it forms a highly reliable connection with the resistor and with the other conductor, for example to a conductor formed by etching of a copper layer. These connections between the resistor and the silver electrode and between the silver electrode and the copper film conductor are made by mutually overlapping parts of both printed layers. In addition, the conductors are often formed of the same silver material as that of the electrode of the resistor.

The conductive silver material used in the printed-resistor circuit board is applied, as an electrode of a resistor and a conductor, at an insulating portion on the surface of the printed circuit board on which the conductor connection pattern is formed by etching of the copper film, at the edge of the board and through holes in the board. When these silver conductors are isolated from each other, during the use of the circuit usually there is some potential difference therebetween. Also, there is some potential difference between the silver conductor and any other conductor such as the copper layer, terminals and holders for discrete components, terminals of connectors, metal plates for housing or mounting the board, etc. In this case, there is a problem that silver migrates from a higher potential portion to a lower potential portion when the board is used. Many problems are caused by the migration of the silver for example, the conductivity of the silver conductor of a higher potential becomes poor and reliability is decreased. Further, because the insulating surface near the silver conductor is covered with the migrated silver which acts as a short circuit path, insulation between the conductors is decreased, and resistance of the resistor is decreased. Moreover, there is a deterioration in the outside appearance of the board. In the extreme case, there is a problem of safety because there occurs a tracking phenomena on the insulating board which causes a discharge breakdown.

Such undesirable migration of silver certainly occurs, although the degree of migration depends upon the various factors such as the material of the insulating board, the resin contained in the silver conductor, the humidity, the potential difference, the amount of formalin remaining in the phenol resin or the melamine resin, the distance between the conductors and the shape of the edge of the printed conductor. Migration is also observed for the other conductive materials such as gold and palladium, but in these cases the rated migration is less that one-hundredth of that of silver and so it is not a problem in practice. However, as these materials are much more expensive than silver, it is uneconomical to make use of them, and so these materials are not used in practice in place of silver. When a cheap material, namely the carbon resin system, is sued for the printed resistors, a conductor from the silver resin system is necessarily employed. However, because of the problem of migration of silver, this system is not widely promoted in spite of the coat benefit.

Figure 2:
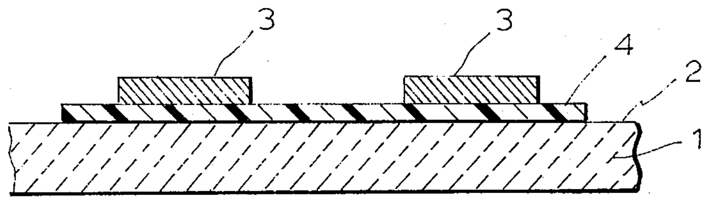
FIG. 2 is a schematic sectional view of the printed circuit board according to the invention in which an under coat is formed at the location of the printed conductive component.
Figure 3:
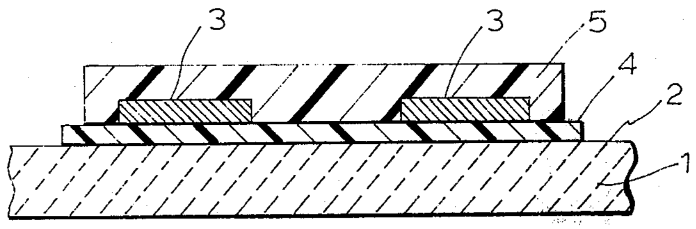
FIG. 3 is a schematic sectional view of the printed circuit board according to the invention in which both the over coat and the under coat are formed at the printed location of the conductive component.

In the printed circuit board according to the present invention, the conventional problem, migration of silver can be overcome by applying a layer, which comprises insulating resin and organic inhibitors, of an over-coating or under-coating or both of them selectively to the portions corresponding to the conductors of silver resin. Several examples of the printed circuit board according to the invention are shown in the attached drawings, usually a flat plate board. That is, FIG. 1 schematically shows the silver electrodes 3 on the surface 2 of the circuit board 1 and the vicinity of the electrodes is over coated with the layer 5. There is a potential difference between the electrodes 2. FIG. 2 shows that before forming the electrodes 3 on the board 1, the under layer 4 is formed at the portions corresponding to the electrodes 3 and the vicinity thereof. In FIG. 3, both the over coating layer 5 and the under coating layer 4 are applied at the location of the electrodes 3 and in the vicinity thereof. For example, in case of FIG. 3, the under coating layer 4 has a thickness of 20$\mu$ and is applied by screen printing with epoxy resin at the portion as described above and curing the printed resin at 130°C for 30 minutes, then the electrodes 3 having a thickness of 10$\mu$ are applied by screen printing with silver paint and firing the printed silver paint at 120°C for 10 minutes, and last the over coating layer 5 having a thickness of 20$\mu$ is applied by screen printing with the same epoxy resin as the under coating layer so as to cover the surface and the edges of the electrodes 3. The printed resin is cured at 110°C for 30 minutes. The thickness of these layers and the electrodes can be adjusted to be from 5 to 100$\mu$ according to the thickness of the mask of the screen mesh used during screen printing.

The under coating layer has the effect of preventing influence of the material on the board which otherwise accelerates migration of silver, and the over coating layer prevents penetration of humidity and dew. However, migration of silver can not be suppressed sufficiently merely be applying these layers of insulating resin. According to the invention, a suitable amount of organic inhibitor is mixed with the resin for the over coating and under coating layers, so that migration of silver can be inhibited to a point where it is negligible. For the resin for these layers, thermo-setting epoxy resin, unsaturated polyester resin, polybutadiene resin, etc. are preferable, and it is also possible to use malamine resin, alkyd resin, phenol resin, polyurethane resin, etc. For the inhibitor, use of an inorganic inhibitor is undesirable according to the experiments because there are caused cracks and bluming of the printed conductors and resistors on the under coating layer and there is an increase of permeability of the over coating layer to water. The desirable materials of the organic inhibitor include organic amine compounds and azole compounds such as aromatic amine (or imine) and saturated cyclic amine. Practically, there are used for the amine compounds diethylamine, triethylamine, decamethyleneimine, dinormalamylamine, cyclohexyldodecylamine, isopropylamine, dibutylamine, dicyclohexylamine, diethanolamine, isopropylhexylamine, diiobutylamine, triethanolamine. For the azole compounds, there are used, for example, benzotriazole, benzoimidazole, 2-methylimidazole, 2-ethyl-4-methylimidazole, 2-heptadecylimidazole, 2-phenylimidazole and 2-heptadecylimidazole.

EXAMPLE 1

An insulating plate of phenol resin laminated to a paper base was used for the circuit board. On one surface of the board, lines of silver-resin paint (DuPont Co., No. 5504) were applied having a width of 1.0 mm at a spacing between lines of 1.0 mm and a thickness of 10μ, and the applied layer was fired at 130°C for 30 minutes. Before and after forming the above silver layer, an under coating layer and an over coating layer having a thickness of 20μ were printed on certain parts of the board and over some of the lines as described below, and fired at 120°C for 30 minutes. For the composition of the over coating and under coating layers, the following composition was used:

| | |
|---|---|
| resin: | (epoxy resin 828, Shell Petroleum Co.) 100 weight parts |
| solvent: | ethylcarbitoleacetate 100 weight parts |
| hardner: | hexahydrophtalic acid anhydride 0.3 weight parts |
| inhibitor: | n-cyclohexyl-n-dodecylamine 1 weight parts |

Then, a voltage of 100V DC was applied to the lines and the time when the silver layers were short-circuited was measured at the conditions of temperature of 40°C and the humidity of 90 to 95%RH for various cases. There were five combinations of printed lines, under coatings and over coatins: sample A had no over coating layer and no under coating layer; sample B had only the over coating layer containing the inhibitor; the sample C had only the under coating layer containing the inhibitor; the sample D had both the over coating and under coating layers containing the inhibitor, respectively; and the sample E had also both the over coating and under coating layers but these layers did not contain the inhibitor. The measures results are shown in TAble 1.

Table 1

| sample | A | B | C | D | E |
|---|---|---|---|---|---|
| over coat | X | O | X | O | O |
| under coat | X | X | O | O | O |
| inhibitor | X | O | O | O | X |
| short-circuit time (hr) | 11 hr 25 min. | 1085 | 1800 | 9800 | 419 |

From the Table 1, it is will be seen that in the sample A having no resin layer the silver layer is short-circuited quickly, and that the time until a short-circuit is caused is somewhat lengthened by applying a resin layer as both an under coating and an over coating and is still further applying coating layers containing the inhibitor therein in accordance with the invention. Using an accelerating factor of 40 times, for example, the time 1000 hours corresponds to several years. That is, it is considered that the printed circuit according to the invention can be used at least several years without failure due to short circuit owing to migration of silver.

EXAMPLE 2

Instead of Epicoat 828 of the example 1, bromated epoxy resin (Shell Petroleum Co., Epicoat 511) was used for the resin in the coating composition, anad the similar tests were carried out under the same conditions as in example 1. The results are shown in Table 2.

Table 2

| sample | A | B | C | D | E |
|---|---|---|---|---|---|
| over coat | X | O | X | O | O |
| under coat | X | X | O | O | O |
| inhibitor | X | O | O | O | X |
| short-circuit time (hr) | 8 hr 47 min. | 720 | 1340 | 2800 | 71 |

EXAMPLE 3

For the composition of the over coating and under coating layers, the following composition was prepared:

| | | |
|---|---|---|
| resin: | epoxy Epicoat 828 | 100 weight parts |
| solvent: | ethylcarbitolacetate | 100 weight parts |
| hardner: | hexahydrophtalic acid anhydride | 0.3 weight parts |
| inhibitor: | benztriazole | 1 weight parts |

Under similar conditions as in example 1, the time when the silver layers were short-circuit was measured. The results are shown in Table 3.

Table 3

| Sample | A | B | C | D | E |
|---|---|---|---|---|---|
| over coat | X | O | X | O | O |
| under coat | X | X | O | O | O |
| inhibitor | X | O | O | O | X |
| short-circuit time (hr) | 10 hr 50 min. | 623 | 1230 | 2730 | 221 |

EXAMPLE 4

For the composition of the over coating and under coating layers, the following composition was prepared:

| | | |
|---|---|---|
| Resin: | dimethylmelamine | |
| solvent: | buthylcellosolveacetate | 150 vol. % |
| | solvent naphta | 50 vol. % |
| hardner: | phosphoric acid | 1 wt.% to the resin |
| inhibitor: | 2-ethyl-e-methyl imidazole | 0.02 wt.% to the resin |

Under similar conditions as in example 1, the short circuit time was measured. The results are shown in Table 4.

Table 4

| sample | A | B | C | D | E |
|---|---|---|---|---|---|
| over coat | X | O | X | O | O |
| under coat | X | X | O | O | O |
| inhibitor | X | O | O | O | X |
| short-circuit time (hr) | 11 hr 03 min. | 78 | 231 | 824 | 54 |

EXAMPLE 5

Figure 4:
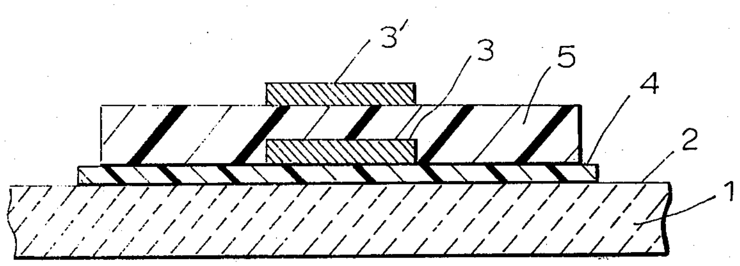
FIGS. 4 to 18 show various modifications of the printed circuit board according to the invention.

While examples 1 to 4 are tests for single silver layers formed on a single surface, in the present example the silver layers were placed so as to be opposed to each other and separated by a layer of coating material as shown in FIG. 4. That is, after forming one silver layer 3 on the under coating layer 4 on the board 1, an intermediate layer 5 was applied over the silver layer 3 and the vicinity thereof, and then a second other silver layer 3' was placed on the layer 5 so as to be spaced from and opposed to layer 3. These silver layers had a thickness of 10$\mu$ and in length of 10 mm at an interval of 1.0 mm. For the composition of the under coating layer 4 and the intermediate layer 5, the same composition as the example 1 was used with the inhibitor being n-cyclohexyl-n-dodecylamine (sample b) and 2-ethyl-4-methyl imidazole (sample c). Under the conditions of a DC voltage of 100V, temperatures of 40°C and 90 to 95 %RH, the short circuit times were measured. The results are shown in Table 5.

Table 5

| sample | a | b | c |
|---|---|---|---|
| inhibitor | X | O | O |
| short circuit time (hr) | 2 hr 18 min. | 1270 | 181 |

The above examples are for the simple case where the printed circuit is formed on one surface of the board. However, usually a practical printed circuit board has the printed circuits formed on both surfaces thereof and extending through the holes proved therein. In these cases, of course the subject of the invention can also be effectively used. FIGS. 5 to 18 show various modified embodiments of the invention.

Figure 5:
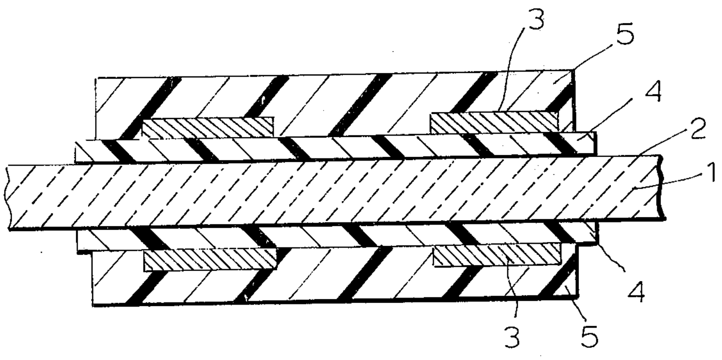

In FIG. 5, there are formed both surfaces 2 of the board 1, the under coating resin layers 4, and the silver conductors 3 such as the electrodes of a printed resistor are formed thereon. Also, the over coating resin layers 5 are formed so as to cover the silver conductors 3 and the insulating surface in the vicinity of the conductors. These resin layers 4 and 5 of course contain the organic inhibitor as described hereinbefore (hereinafter, the resin layer will be understood to mean a layer comprising the insulating resin and the organic inhibitor).

Figure 6:
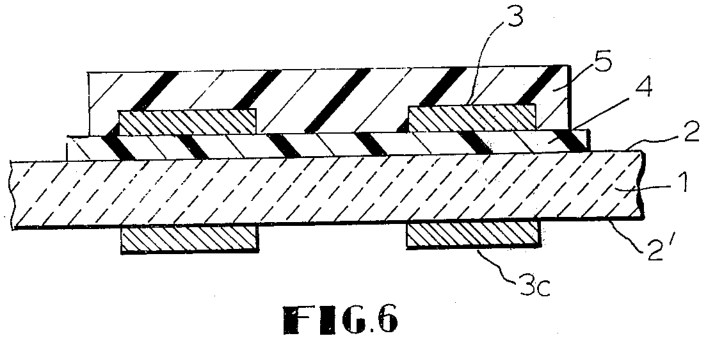

In FIG. 6, while the arrangement on the surface 2 of the board 1 is similar to FIG. 5, on the back surface 2' of the board 1, there is formed a copper conductor 3*c* by etching of a copper layer, and so coating formed by the resin layer is omitted.

Figure 7A:
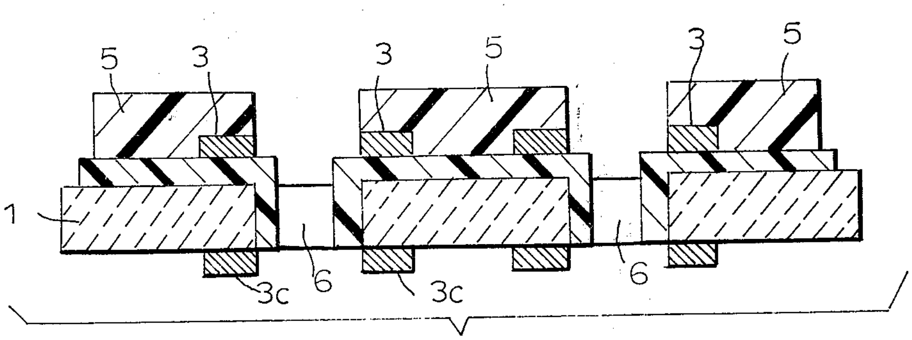
Figure 7B:
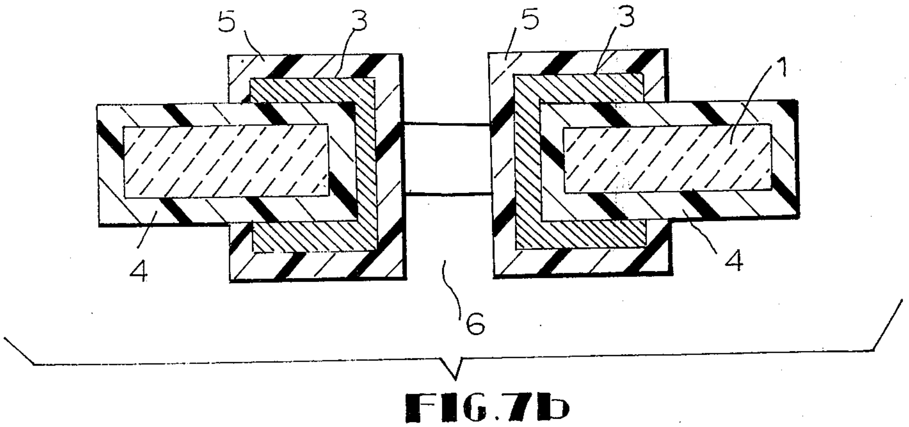

In FIGS. 7*a* and 7*b*, there are holes 6 through the board 1, and the under coating resin layers 4 are applied to the portions on which the silver conductors 3 are to be located and on the walls of the holes 6, so that migration of silver through the holes 6 can be prevented. In FIG. 7*a*, the conductor 3*c* is copper as described in connection with FIG. 6. When the silver conductor 3 extends through the holes 6, the over coating resin layer is also applied through the holes, as shown in FIG. 7*b*.

Figure 8:
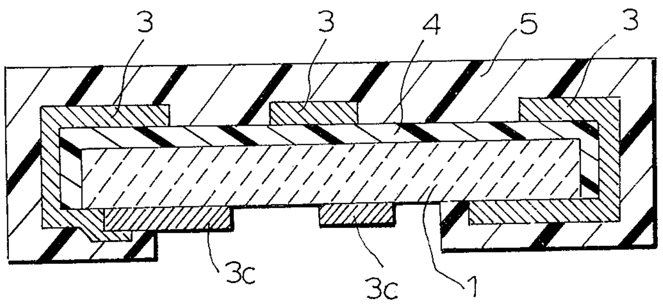

In FIG. 8, the silver conductors 3 are provided not only on the surface 2 but also at the edge 7 of the board so as to connect the two surfaces thereof. Accordingly, the under coating resin layers 4 and the over coating resin layers 5 are applied, as shown in the figure.

Figure 9:
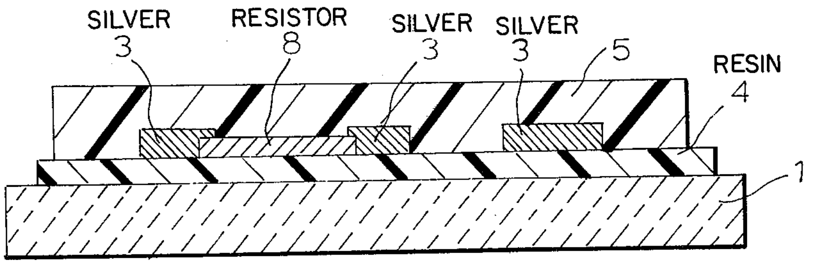
Figure 10:
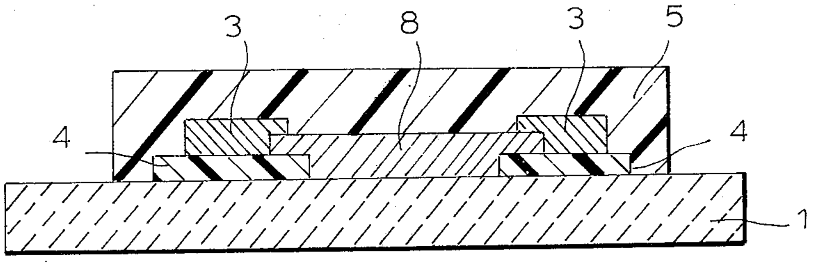
Figure 11:
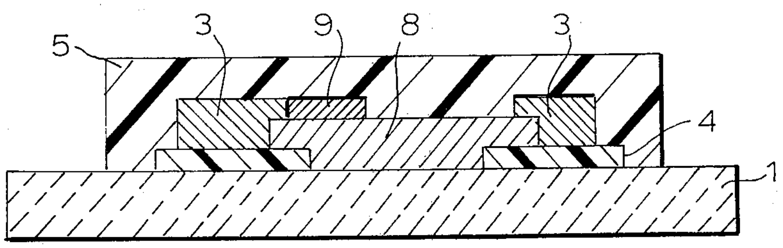

In FIG. 9, on the under coating resin layer 4 applied on the board, there are printed a resistor 8 and silver conductors 3 containing the electrodes of the resistor 8, and the over coating resin layer 5 is formed so as to cover both the conductors 3 and the resistor 8. In this case, not only is migration of silver prevented but also the anodization reaction of the resistor can be prevented. Such a reaction is caused especially when the circuit board is used in high humidity. This effect of preventing anodization is brought about because the organic inhibitor absorbs hydrogen gas $H_2$ produced by electrolytic decomposition of the absorbed water. In FIG. 10, the under coating layers 3 are formed under the conductors 4 and in the vicinity thereof, and not formed under the printed resistor 8. Further, in FIG. 11 which is a modified form of FIG. 10, there is another silver conductor layer 9 on a part of the resistor 8. The layer 9 is used for adjusting the resistance value of the resistor 8. The over coating layer 5 is applied so as to cover all of the under coating resin layers 4, the resistor 8, the conductor 3 and the resistance adjusting layer 9.

Figure 12:
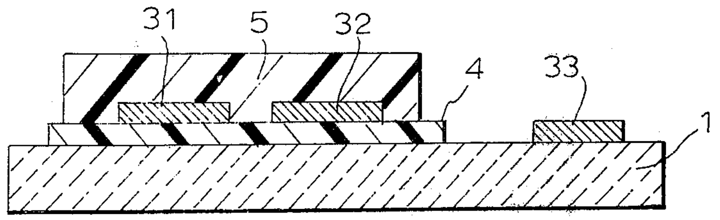
Figure 13:
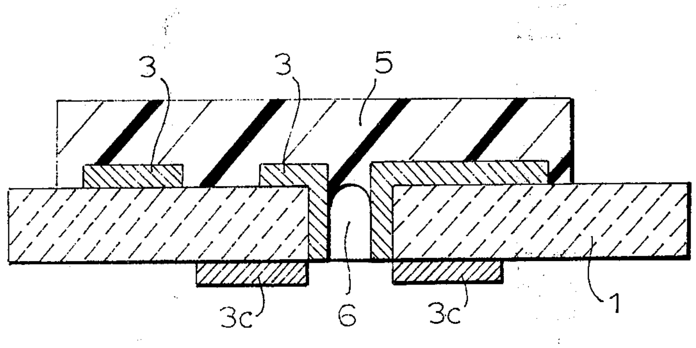
Figure 14:
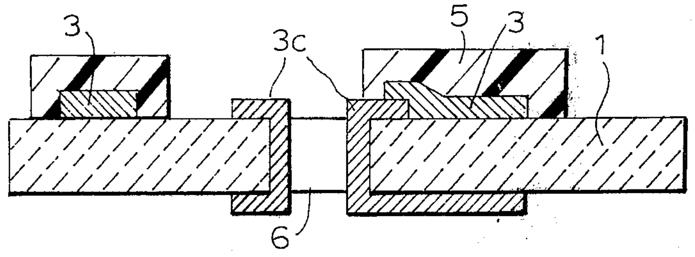
Figure 15:
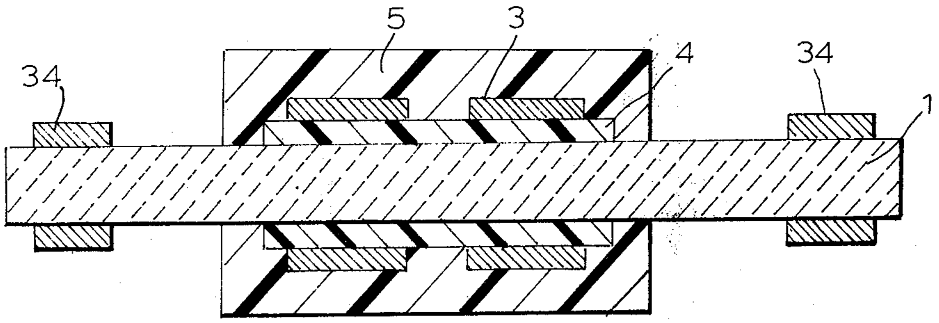
Figure 16:
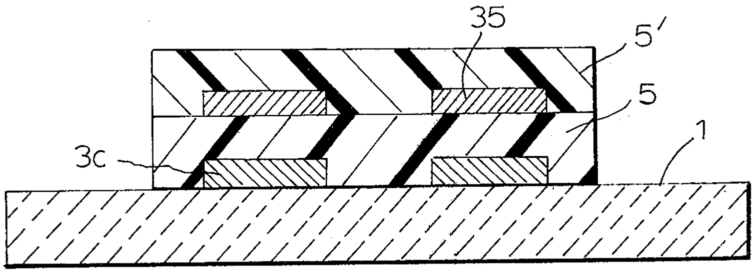
Figure 17:
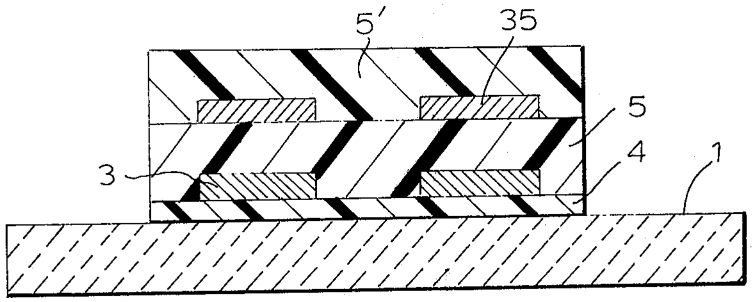

It is obvious from the description set forth hereinbefore that the under coating resin layer and the over coating resin layer can be applied to the whole surface of the board or partially corresponding to the conductors, and this depends upon the manufacturing process, cost, etc. Besides, as shown in FIG. 12, these resin layers can be applied only over the silver conductors 31 and 32 between which there is a potential difference and need not be applied over the conductor 33 having the same potential as that of 32. Even by this partial applying of the resin layers, migration of silver can be effectively suppressed, and the amount of resin used can be reduced. Also, as shown in FIGS. 13 and 14, these resin layers can be omitted from the wall of the hole 6 when the conductor 3*c* on the back surface 2' or the conductor 3*c* extending through the hole 6 is another conductive material such as copper, since migration of silver through the hole 6 will not occur. (In FIGS. 13 and 14, only the over coating 5 is applied, respectively.) For preventing migration of silver at the edge of the board, it is effective to print another conductive layer 34, as shown in FIG. 15, so as to surround the printed silver conductors 3, to which no voltage is applied. In this case, the resin over coating layer can be ommited for the conductive layer 34.

For a multi-layer structure of a circuit board, the resin layers are applied according to the used material used for the conductors. That is, while there need not be an under coating layer 4 for the copper conductor 3*c* in FIG. 16, it is applied for the silver conductor 3 in FIG. 17. As the upper conductor 35 is silver layer in both FIGS. 16 and 17, there are applied the over coating resin layers 5 and 5'. The layer 5 also acts as the under coating layer for the upper conductor 35.

Figure 18:
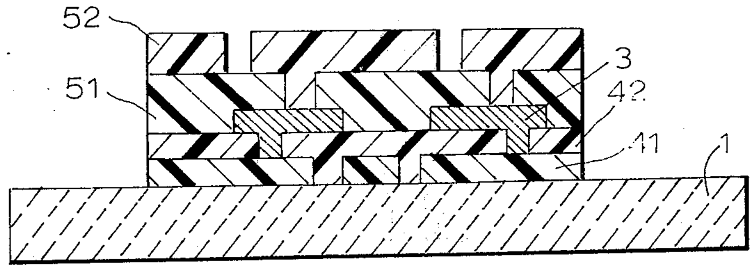

Usually, with a thin layer, there is a problem that undesirable pin holes sometimes occur. In the printed circuit board of the invention, in order to prevent pin holes, it is effective to apply a second layer of the same resin layer after once printing and firing the first over coating resin layer. In FIG. 18, after the under coating resin layer 41 is applied and hardened by heating, a similar layer 42 is again applied so as to cover the pin holes. Two layers 51 and 52 of over coating are also applied.

It is easily understood that these under coating layer and over coating layers are also effective for a printed capacitor formed on the board such as a single layer capacitor formed by printing an under electrode layer, a dielectric layer and an upper electrode layer in this order, and a laminated capacitor. Further, although the above examples describe a flat plate circuit board, for some uses a board having the shape of a bar or a cylinder can be used, and for the conductors formed on these boards the under coating layer and the over coating layer can also be applied effectively so as to suppress migration of silver.

What is claimed is:

1. In a printed circuit board having at least one surface thereof electrically insulating material and at least one printed electronic component on said surface and at least two conductors on said surface which during operation of the circuit will be at different potentials and at least one of which is connected to said component, said conductors having a composition which is at least partly silver, the improvement comprising a coating layer composed of electrically insulating resin and an organic inhibitor and which is on the surface of said circuit board and covering at least part of the surface of said conductors for inhibiting migration of silver, which is contained in said conductor, from the conductor of higher potential to the conductor of lower potential.

2. The improvement as claimed in claim 1 in which said coating layer is an under coating layer between said circuit board and said conductor.

3. The improvement as claimed in claim 1 in which said coating layer is an over coating layer over the conductor and at least part of the circuit board around the conductor.

4. The improvement as claimed in claim 1 in which there is an under coating layer between said circuit board and said conductor and an over coating layer over the conductor and at least part of the circuit board around the conductor.

5. The improvement as claimed in claim 1 wherein said organic inhibitor is a compound taken from the group consisting of amine compounds and azole compounds.

6. The improvement as claimed in claim 1, wherein said circuit board has a hole therethrough, there is a conductor on the opposite surface of said circuit board, and extends through said hole for connecting the component and the conductors on both the surfaces of said board, and said coating layer extends through said hole.

7. The improvement as claimed in claim 1, wherein there is a conductor on the opposite surface of said circuit board and said conductor extends over the edge of said board for connecting the component and the conductors on both surfaces of said board, and said coating layer extends over said edge.

8. The improvement as claimed in claim 1, further comprising a further conductor of an electrically conductive material other than silver on one surface of said board surrounding said component and said conductor whereby there is no potential difference of the other surface of the circuit board the coating layer at the edge of said board can be omitted.

9. The improvement as claimed in claim 1, wherein there is a plurality of conductors positioned in at least two layers and an over coating layer over each of said conductors whereby said conductors are separated by a coating layer.

10. The improvement as claimed in claim 1, wherein said coating layer has a further coating layer thereon for covering pin holes in the first mentioned coating layer.

11. The improvement as claimed in claim 1, wherein said coating layer is only over said conductor which operates at the high potential.

12. The improvement as claimed in claim 1, wherein said coating layer is over the whole of said surface of said circuit board.

13. The improvement as claimed in claim 1, wherein said coating layer is only at the portions corresponding to said conductors.

14. The improvement as claimed in claim 1, wherein said coating layer is over both of said conductors.

15. The improvement as claimed in claim 14, wherein said component is a printed resistor having a composition of silver and resin.

* * * * *